(12) United States Patent
Iedema et al.

(10) Patent No.: US 11,129,276 B2
(45) Date of Patent: Sep. 21, 2021

(54) SOCKET ASSEMBLY, LIGHT EMITTER MODULE, AND LIGHTING SYSTEM

(71) Applicants: TE Connectivity Nederland BV, s'Hertogenbosch (NL); Tyco Electronics UK Ltd, Swindon (GB)

(72) Inventors: Jeroen Iedema, Wolvega (NL); Olaf Leijnse, Asten (NL); Peter Poorter, Wijk en Aalburg (NL); Jonathan Catchpole, West Hanney (GB)

(73) Assignees: TE Connectivity Nederland BV, S'Hertogenbosch (NL); Tyco Electronics UK Ltd, Dorcan (GB)

( * ) Notice: Subject to any disclaimer, the term of this patent is extended or adjusted under 35 U.S.C. 154(b) by 270 days.

(21) Appl. No.: 16/125,947

(22) Filed: Sep. 10, 2018

(65) Prior Publication Data
US 2019/0008045 A1    Jan. 3, 2019

Related U.S. Application Data

(63) Continuation of application No. PCT/EP2017/055300, filed on Mar. 7, 2017.

(30) Foreign Application Priority Data

Mar. 11, 2016 (DE) .................... 10 2016 204 079.0

(51) Int. Cl.
*H05K 1/14* (2006.01)
*H01R 12/71* (2011.01)
(Continued)

(52) U.S. Cl.
CPC ........... *H05K 1/142* (2013.01); *F21V 19/004* (2013.01); *F21V 19/0055* (2013.01);
(Continued)

(58) Field of Classification Search
CPC .... H05K 1/142; H05K 1/141; H05K 7/20509; H05K 1/184; H05K 3/325;
(Continued)

(56) References Cited

U.S. PATENT DOCUMENTS

2010/0163914 A1   7/2010   Urano
2010/0219758 A1   9/2010   Melzner et al.
(Continued)

FOREIGN PATENT DOCUMENTS

EP     2623854 A2     8/2013
WO  2015101420 A1     7/2015

OTHER PUBLICATIONS

English translation of WO 2015/101420 A1 (Year: 2015).*
PCT Written Opinion of the International Searching Authority and International Search Report, dated Jun. 7, 2017, 12 pages.

*Primary Examiner* — Rajarshi Chakraborty
*Assistant Examiner* — Hana S Featherly
(74) *Attorney, Agent, or Firm* — Barley Snyder

(57) ABSTRACT

A socket assembly comprises a base frame formed of a thermally conductive material holding a light emitting diode (LED) package to a support structure, a contact element electrically contacting the LED package, and an isolator PCB. The LED package includes an LED PCB having an LED mounted on the LED PCB. The base frame includes a base mounted to the support structure and mechanically engaging the LED PCB so that the LED package is attached to the support structure with a predetermined holding force. The contact element electrically connects the isolator PCB to the LED PCB. The isolator PCB supplies electrical power to the LED. The isolator PCB has a first surface and a second surface; the second surface is in heat transmitting contact with the base frame and the electronic component is disposed on the first surface of the isolator PCB and electrically connected to the LED.

17 Claims, 8 Drawing Sheets

(51) Int. Cl.

| | |
|---|---|
| *H05K 7/20* | (2006.01) |
| *F21V 23/00* | (2015.01) |
| *F21V 23/06* | (2006.01) |
| *F21V 19/00* | (2006.01) |
| *F21V 19/04* | (2006.01) |
| *F21Y 115/10* | (2016.01) |
| *H01R 12/70* | (2011.01) |
| *H05K 3/00* | (2006.01) |
| *H05K 3/32* | (2006.01) |
| *H05K 1/18* | (2006.01) |

(52) U.S. Cl.
CPC ............ F21V 19/04 (2013.01); F21V 23/005 (2013.01); F21V 23/006 (2013.01); F21V 23/06 (2013.01); H01R 12/714 (2013.01); H05K 1/141 (2013.01); H05K 7/20509 (2013.01); *F21Y 2115/10* (2016.08); *H01R 12/707* (2013.01); *H01R 12/7064* (2013.01); *H05K 1/184* (2013.01); *H05K 3/0061* (2013.01); *H05K 3/325* (2013.01); *H05K 2201/048* (2013.01); *H05K 2201/09063* (2013.01); *H05K 2201/10106* (2013.01)

(58) Field of Classification Search
CPC ... H05K 2201/048; H05K 2201/09063; H05K 2201/10106; F21V 19/004; F21V 19/0055; F21V 19/04; F21V 23/005; F21V 23/006; F21V 23/06; H01R 12/714; H01R 12/7064; H01R 12/707; F21Y 2115/10
USPC .......................................................... 362/396
See application file for complete search history.

(56) References Cited

U.S. PATENT DOCUMENTS

| | | | |
|---|---|---|---|
| 2011/0279057 A1* | 11/2011 | Briggs | H05B 47/175 315/294 |
| 2013/0249431 A1* | 9/2013 | Shteynberg | H05B 45/37 315/287 |
| 2014/0063814 A1 | 3/2014 | McGowen et al. | |

* cited by examiner

SOCKET ASSEMBLY, LIGHT EMITTER MODULE, AND LIGHTING SYSTEM

CROSS-REFERENCE TO RELATED APPLICATIONS

This application is a continuation of PCT International Application No. PCT/EP2017/055300, filed on Mar. 7, 2017, which claims priority under 35 U.S.C. § 119 to German Patent Application No. 102016204079.0, filed on Mar. 11, 2016.

FIELD OF THE INVENTION

The present invention relates to a socket assembly and, more particularly, to a socket assembly for a light emitter module.

BACKGROUND

LED lighting systems typically include one or more LED packages that include one or more LEDs on a printed circuit board (PCB), which is referred to herein as an "LED PCB". The LED packages may be what is commonly referred to as a "chip-on-board" (COB) LED, or may be any other type of LED package, such as, but not limited to, an LED package that includes an LED PCB and one or more LEDs soldered to the LED PCB. Lighting systems that are based on semiconductor lasers, e.g. vertical-cavity surface-emitting lasers ("VCSEL") arrays, may be assembled according to the same principles as LEDs and have to meet the same strict requirements regarding thermal management and size reduction.

In known LED lighting systems, the LED package is held within a recess of a socket housing that is mounted to a support structure of the lighting fixture, for example a base, a heat sink, and/or the like. When the LED package is held by the socket housing, the socket housing may apply a force to the LED package to press the LED package toward the support structure. The force applied by the socket housing, for example, may hold the LED PCB in engagement with the support structure or a thermal interface material that extends between the LED PCB and the support structure. The force applied by the socket housing to the LED package, however, may cause the LED package to fail; the force applied to the LED package by the socket housing may be sufficiently high to fracture the LED PCB. Moreover, the force applied by the socket housing to the LED package may be insufficient to securely hold the LED package between the socket housing and the support structure, which may allow the LED package to vibrate and thereby fracture or otherwise fail.

There is a need in the market for LED lighting systems that are dimmable and control of their luminous output can be performed easily by a user or an automatic system. Known LED lighting systems, however, are too bulky and do not provide a sufficient thermal management for a further miniaturization. International Patent Application No. WO 2015/101420 A1, for example, discloses an LED socket assembly that uses a metal base frame for holding an LED package to a support structure. There is still a need for an improved socket assembly, a corresponding light emitter module and a solid state lighting system providing maximum functionality with minimum space requirements and an efficient thermal management, while simultaneously being cost efficient and easy to assemble.

SUMMARY

A socket assembly comprises a base frame formed of a thermally conductive material holding a light emitting diode (LED) package to a support structure, a contact element electrically contacting the LED package, and an isolator PCB. The LED package includes an LED PCB having an LED mounted on the LED PCB. The base frame includes a base mounted to the support structure and mechanically engaging the LED PCB so that the LED package is attached to the support structure with a predetermined holding force. The contact element electrically connects the isolator PCB to the LED PCB. The isolator PCB supplies electrical power to the LED. The isolator PCB has a first surface and a second surface; the second surface is in heat transmitting contact with the base frame and the electronic component is disposed on the first surface of the isolator PCB and electrically connected to the LED.

BRIEF DESCRIPTION OF THE DRAWINGS

The invention will now be described by way of example with reference to the accompanying Figures, of which.

DETAILED DESCRIPTION OF THE EMBODIMENT(S)

Figure 1:
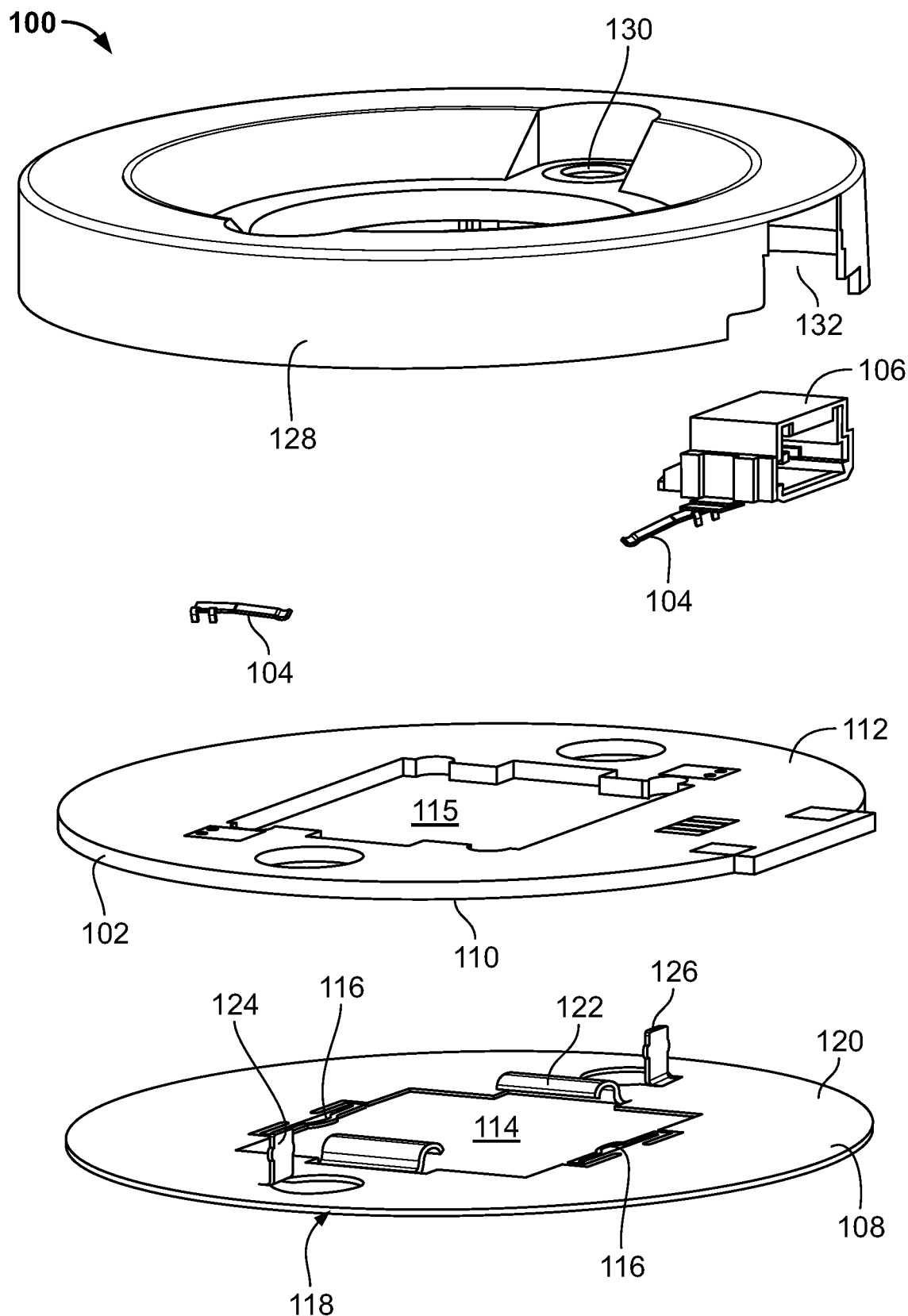
FIG. 1 is an exploded perspective view of a socket assembly according to an embodiment.

Exemplary embodiments of the present invention will be described hereinafter in detail with reference to the attached drawings, wherein like reference numerals refer to like elements. The present invention may, however, be embodied in many different forms and should not be construed as being limited to the embodiments set forth herein. Rather, these embodiments are provided so that the present disclosure will be thorough and complete and will fully convey the concept of the disclosure to those skilled in the art.

A socket assembly 100 according to an embodiment is shown in FIG. 1. The socket assembly 100, also referred to as a holder 100, is configured to mount a light emitting diode (LED) package 134 shown in FIGS. 2 and 3; the socket assembly 100 assembled with the LED package 134 forms a light emitter module 200.

In various embodiments, the light emitter module 200 may be part of a light engine, a light fixture, or other lighting system that is used for residential, commercial, and/or industrial use. The light emitter module 200 may be used for general purpose lighting, or alternatively, may have a customized application and/or end use.

The light emitter module 200 is mounted on a support structure. The support structure may be any structure to which the socket assembly 100 is capable of being mounted, such as, but not limited to, a base, a heat sink, and/or the like. In the exemplary embodiment, the support structure is a heat sink. The support structure includes a mounting surface to which the socket assembly is mounted. In an embodiment, at least a portion of the mounting surface is approximately flat. The support structure may include one or more mounting features, such a threaded openings, for mounting the socket assembly 100 to the support structure.

Figure 2:
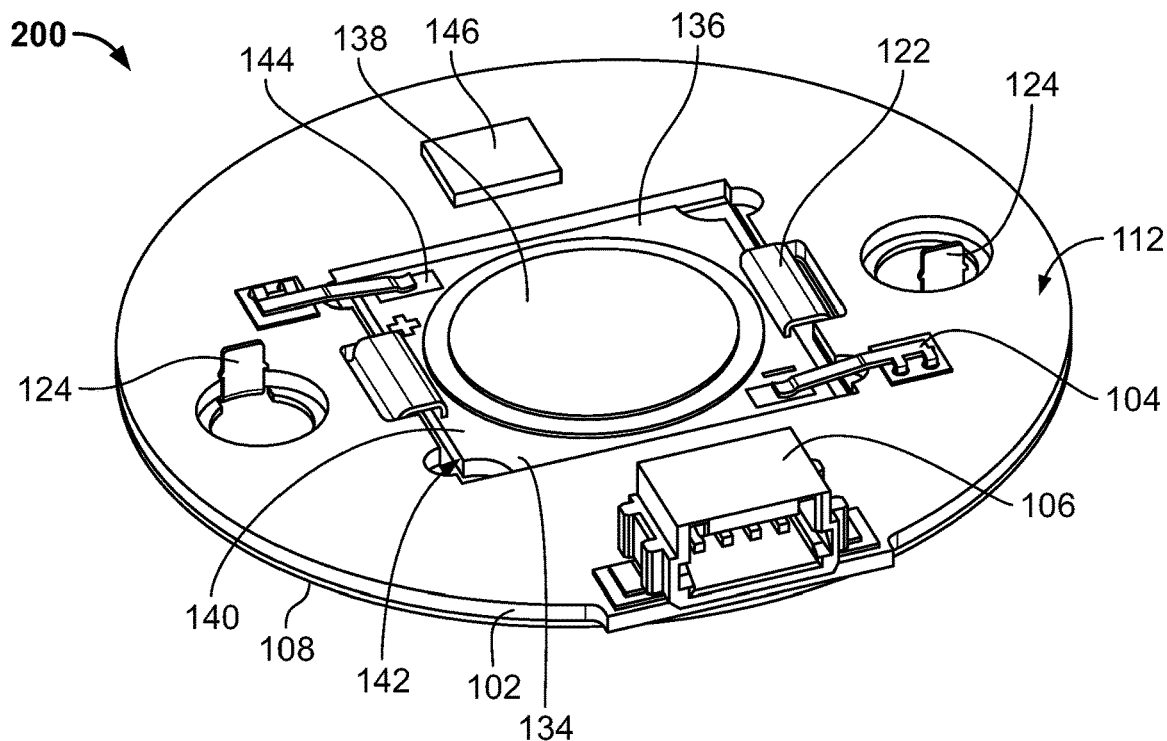
FIG. 2 is a perspective view of a light emitter module including the socket assembly.
Figure 3:
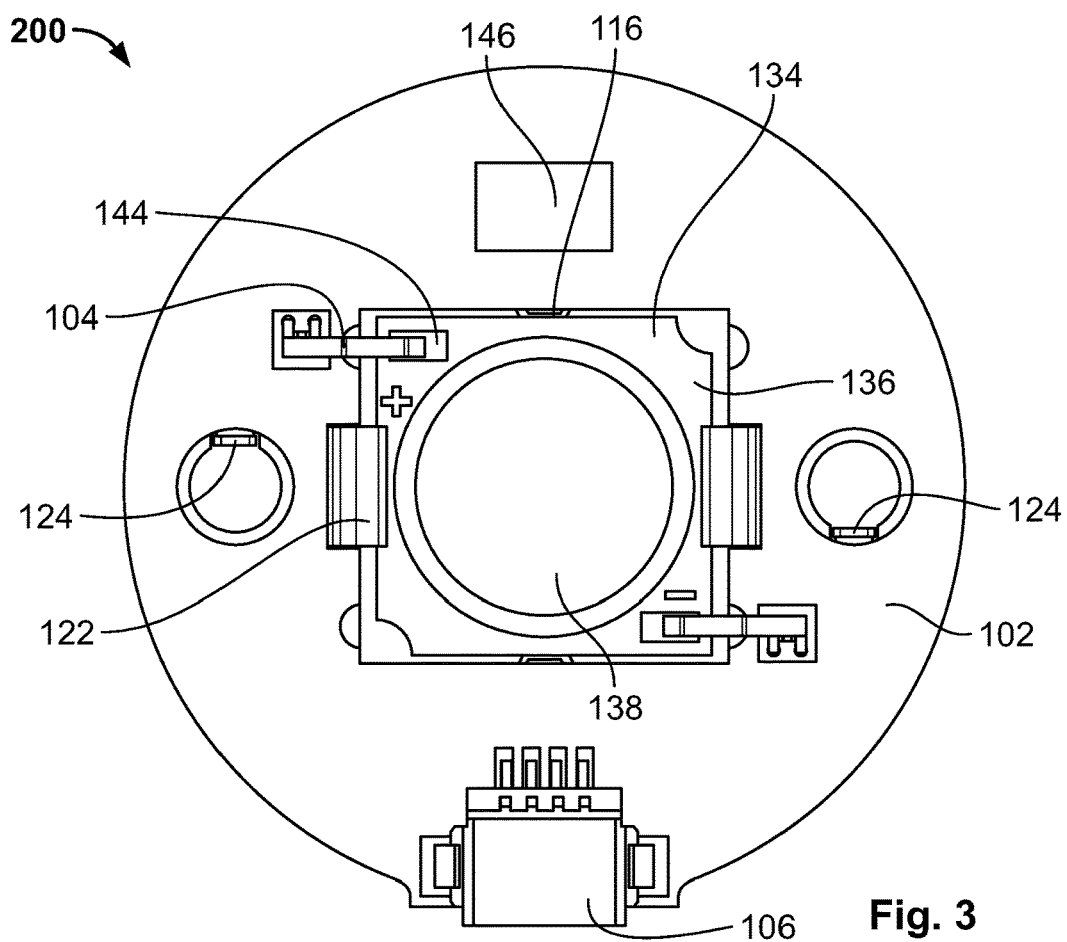
FIG. 3 is a top view of the light emitter module.

The socket assembly 100, as shown in FIGS. 1-3, includes an isolator printed circuit board (PCB) 102 which is electrically connected to the LED package 134. For electrically contacting respective contact pads of the LED package 134, the socket assembly 100 has contact elements 104 which are resilient, and in an embodiment, are formed as metal springs. The socket assembly 100 includes an electrical connector 106 electrically contacting electrically conductive leads on the PCB 102 and connectable to a mating connector.

As shown in FIGS. 1-3, a thermally conductive base frame 108 is arranged between the PCB 102 and the support structure. The base frame 108 is fabricated as a stamped (or laser cut) and bent metal sheet, and in an embodiment, is formed from copper. The base frame 108 has an essentially flat shape so that it is in thermal contact with the PCB 102 on one surface and with the support structure on its other surface.

Figure 4:
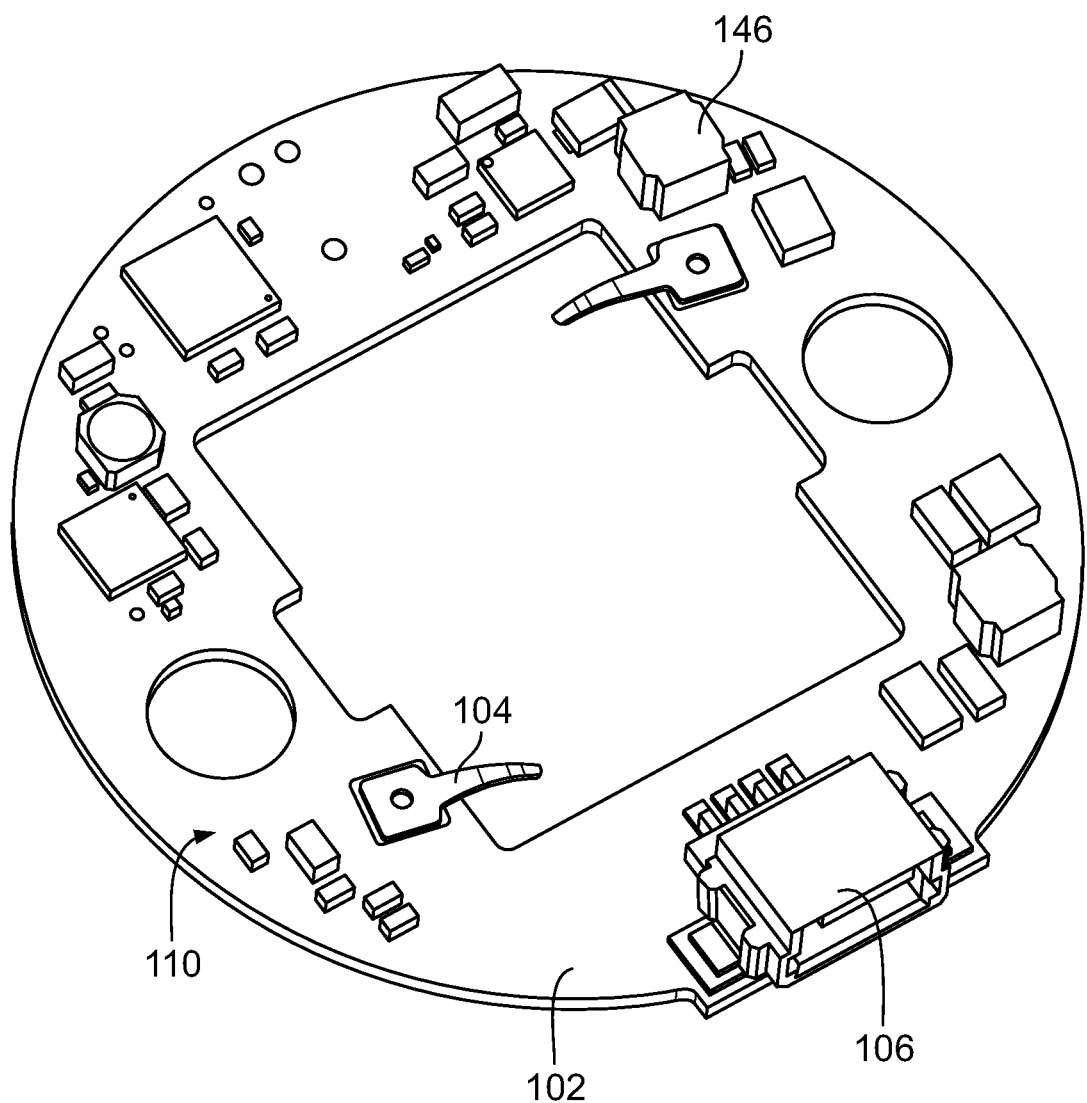
FIG. 4 is a perspective view of an isolator PCB of the socket assembly.

As shown in FIG. 4, the PCB 102 carries at least one electronic component 146 which is arranged on a first surface 112 of the PCB 102. In the following, the first surface 112 will be referred to as the "upper" surface, whereas the second surface 110 of the PCB 102 will be referred to as the "lower" surface. Due to the direct thermal contact between the lower surface 110 of the PCB 102 and the thermally conductive base frame 108, a particularly effective heat dissipation of the heat generated by the electronic component 146 can be achieved.

Figure 9:
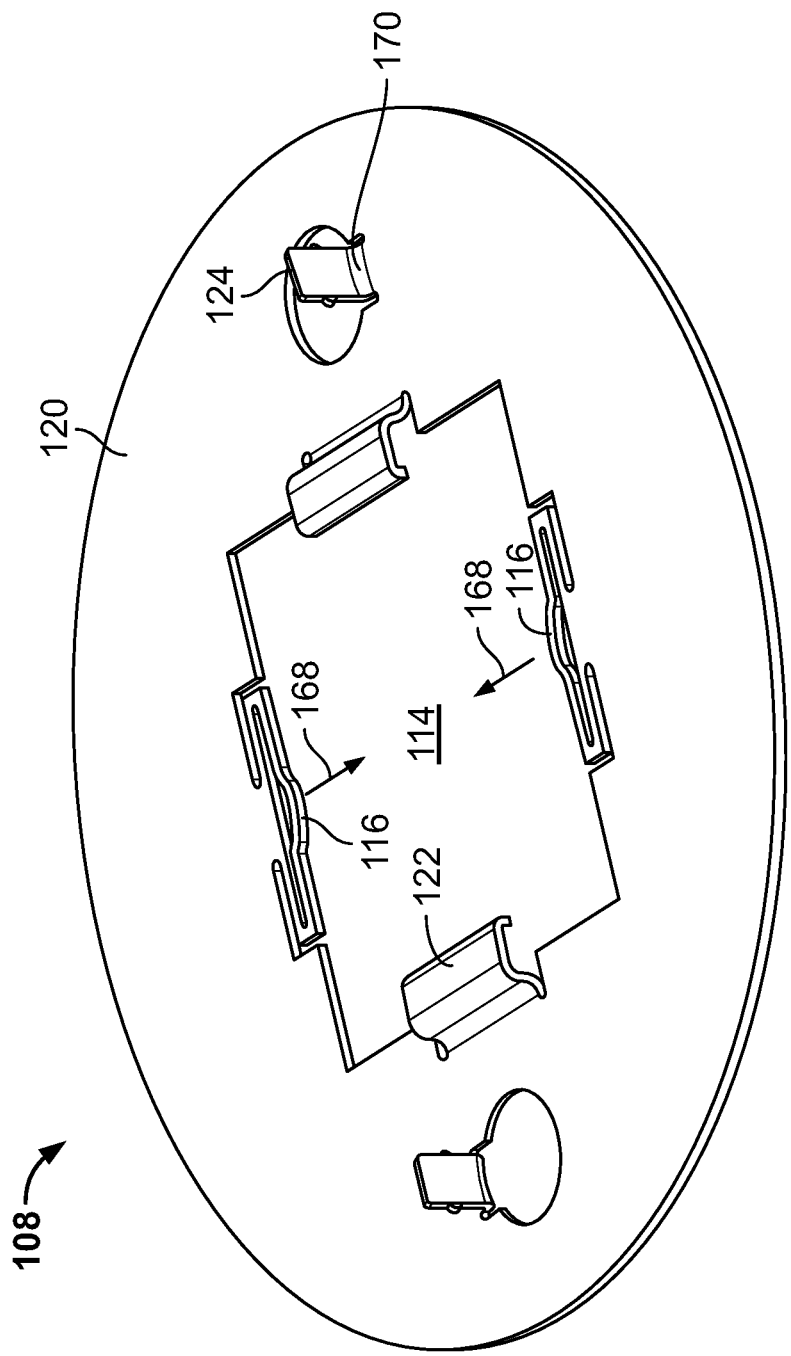
FIG. 9 is a perspective view of a base frame of the socket assembly.

The base frame 108, as shown in FIG. 1, includes a recess 114 for receiving the LED package 134. As shown in FIGS. 1 and 9, the base frame 108 includes two compressible spring elements 116 that extend radially inward into the recess 114 and exert a clamping force on the LED package 134 within the plane of the recess 114. Consequently, the LED package 134 is secured at the base frame 108 even without a support structure being present. Moreover, by resiliently engaging with the LED package 134, the LED package 134 is attachable to the support structure with a pre-determined holding force independent of the influence of further fixing means that fix the socket assembly 100 to the support structure, such as the torque of mounting screws.

The base frame 108, as shown in FIGS. 1 and 9, includes a body 118, which includes a base 120 and one or more spring fingers 122 that extend from the base 120. As described in greater detail below, each spring finger 122 is configured to engage the LED package 134, as shown in FIGS. 2 and 3, to apply a clamping force to an LED PCB to hold the LED package 134 to the support structure. A cut-out 115 is provided in the PCB 102 that essentially matches the outline of the recess 114 and allows the LED package 134 and the spring fingers 122 to pass through.

The body 118 of the base frame 108, in the embodiment shown in FIGS. 1 and 9, includes one or more anvils 124 that extend outward from the base 120. Each anvil 124 extends outward from the base 120 along a central axis of the base 120 to an end 126. The ends 126 are each configured to be engaged by a corresponding fastener such that the fastener applies a clamping force to the base frame 108. Although two are shown, the base frame 108 may include any number of anvils 124.

Figure 5:
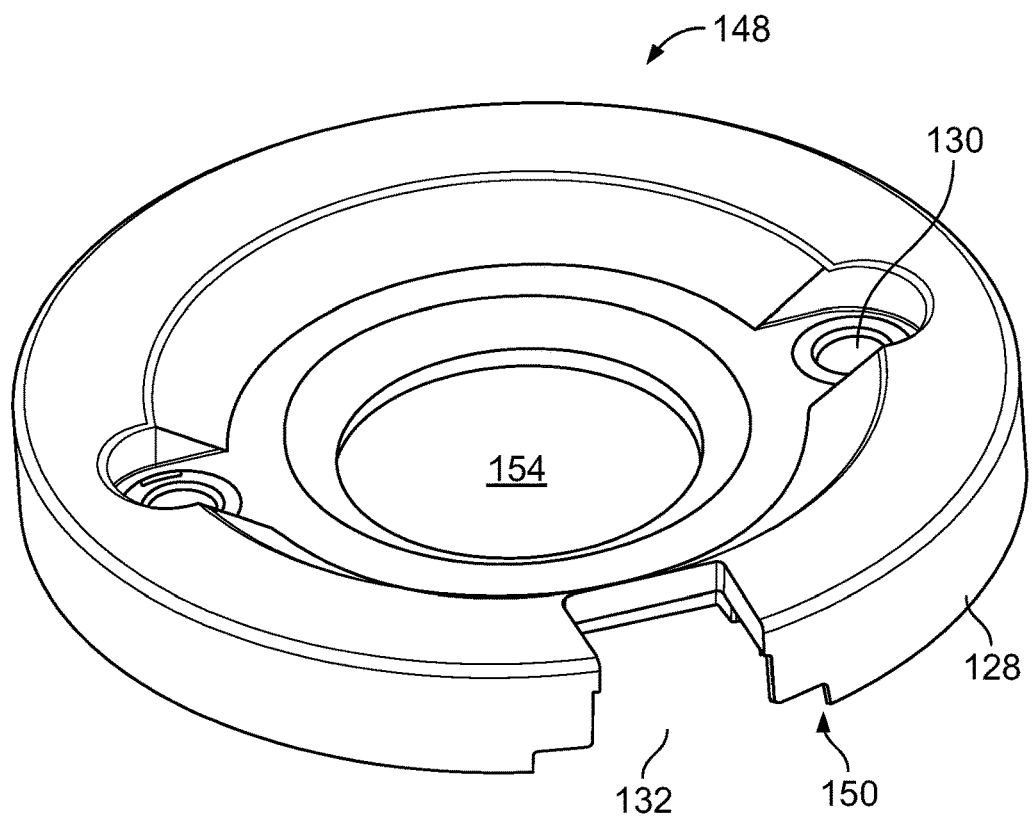
FIG. 5 is a top perspective view of a cover of the socket assembly.
Figure 6:
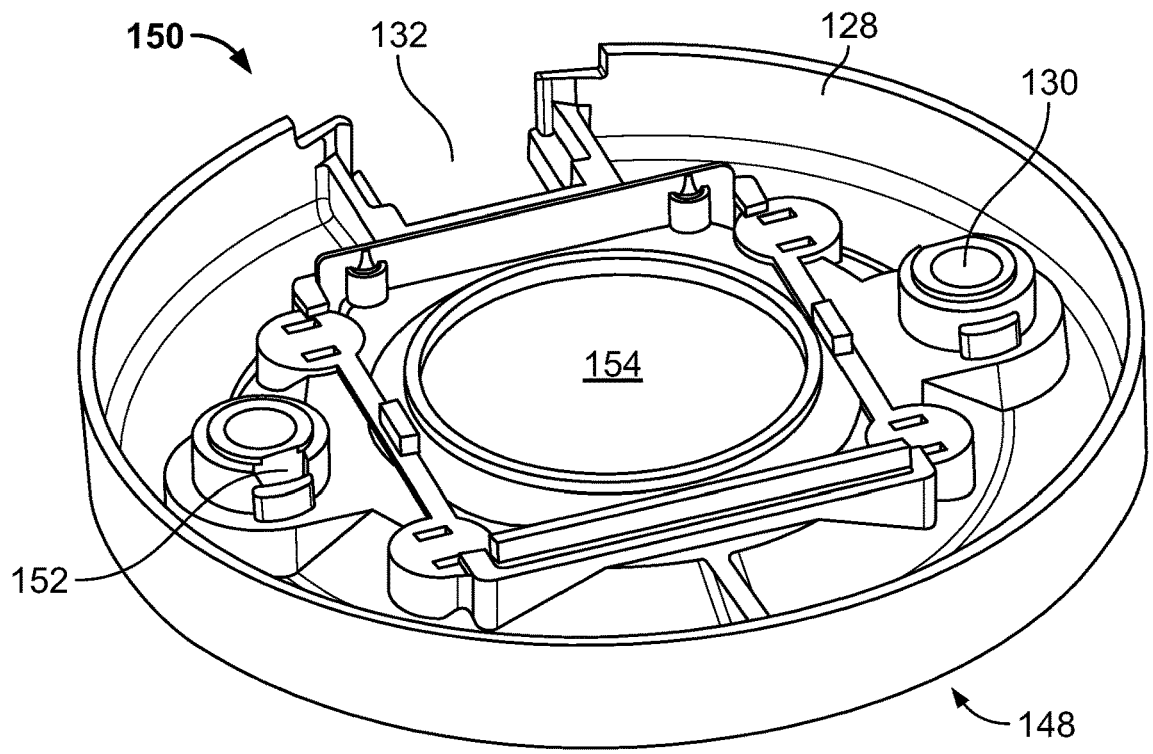
FIG. 6 is a bottom perspective view of the cover.

As shown in FIGS. 1, 5, and 6, a cover 128 is provided that covers the PCB 102 and most of the LED package 134 for providing electrical and mechanical protection. In an embodiment, the cover 128 is formed as a molded part from plastic material. The cover 128 has openings 130 that are configured to receive a fastener, such as a screw or bolt, for mounting the cover 128 to a support structure. A cut-out 132 which is provided at the cover 128 allows the electrical connector 106 to be connected to the mating connector.

The light emitter module 200 is shown in FIGS. 2 and 3, and the cover 128 is omitted in these figures for clarity. As shown in FIGS. 2 and 3, the LED package 134 includes an LED printed circuit board (PCB) 136 with an LED 138 mounted thereto. In the shown embodiment, a single LED 138 is mounted to the LED PCB 136, however, any number of LEDs 138 may be mounted to the LED PCB 136. The LED PCB 136 may be sized appropriately depending on the number of LEDs 138 mounted thereto. The LED PCB 136 includes opposite sides 140 and 142. The LED 138 is mounted on the side 140 of the LED PCB 136. The LED package 134 includes one or more power pads 144 on the LED PCB 136.

In the embodiment shown in FIGS. 2 and 3, the LED package 134 is what is commonly referred to as a "chip-on-board" (COB) LED. In other embodiments, the LED package 134 may be any other type of LED package, such as, but not limited to, an LED package that includes an LED PCB 136 and one or more LEDs 138 soldered to the LED PCB. The LED PCB 136 has a rectangular shape in the exemplary embodiment; in other embodiments, the LED PCB 136 may additionally or alternatively include any other shape, which may depend on the type and/or number of LEDs 138 mounted to the LED PCB 136. A substrate of the LED PCB 136 may be fabricated from any materials, such as, but not limited to, a ceramic, polytetrafluoroethylene, FR-4, FR-1, CEM-1, CEM-3, FR-2, FR-3, FR-5, FR-6, G-10, CEM-2, CEM-4, CEM-5, an insulated metal substrate (IMS) and/or the like.

As shown in FIGS. 2 and 3, each spring finger 122 is configured to engage the LED PCB 136 to apply a clamping force to the LED PCB 136, which acts on the LED PCB 136 in a direction toward the support structure. Each spring finger 122 extends from the base frame 108 in a radially inward direction relative to the central axis. The spring finger 122 is a resiliently deflectable spring that engages the LED PCB 136. When the base frame 108 is used to hold the LED package 134 to the support structure, each spring finger 122 engages a side of the LED PCB 136 and is deflected thereby in a direction away from the support structure. In the deflected position, the spring finger 122 exerts the clamping force on the side of the LED PCB 136 that acts in a direction toward the support structure.

Various parameters of the spring fingers 122 may be selected such that it provides a predetermined clamping force, or range thereof, to the LED package 134. Such parameters of the spring fingers 122 include, but are not limited to, the number of spring fingers 122, the geometry (e.g., shape) of each of the spring fingers 122, the dimensions (e.g., length, width, thickness, and/or the like) of each of the spring fingers 122, the location of each of the spring fingers 122 along the base frame 108, the orientation of each of the spring fingers 122 relative to the base frame 108, the materials of each of the spring fingers 122, and/or the like. The various parameters of the spring fingers 122 may be selected to provide a predetermined clamping force, or range thereof, that facilitates preventing failure of the LED package 134.

Moreover, in order to hold the LED package 134 in place while the light emitter module 200 is not attached to a support structure, the compressible spring elements 116 are provided at the base frame 108 for clamping the peripheral edges of the LED PCB 136. The one or more electronic components 146, such as a driver unit and/or a communication interface, are arranged on the first surface 112 of the isolator PCB 102. The electronic components 146 may comprise passive components, such as resistors, capacitors, or coils, and active components, such as controllers, sensors, or semiconductor switches.

The isolator PCB 102, as shown in FIG. 4, includes the active and passive elements of a driver circuit for driving the LED 138 with a controlled electrical DC power. The interconnecting leads of the PCB 102 are arranged on the surface 110 of the PCB 102 or may be buried in deeper layers of the isolator PCB 102 in an embodiment in which the isolator PCB 102 is a multilayer PCB.

The cover 128 is shown in FIGS. 5 and 6. The cover 128 extends a thickness from a first side 140 to an opposite second side 150. The second side 150 of the cover 128 faces toward the mounting surface of the support structure. The cover 128 includes one or more mounting members 130 that are used to mount the cover 128 to the support structure. Each mounting member 130 cooperates with a corresponding mounting feature, such as openings, of the support structure to mount the cover 128 to the support structure. The cover 128 may include any number of the mounting members 130, each of which may be any type of mounting member. In the shown embodiment, the cover includes two mounting members 130, which are openings that are configured to receive fasteners. Each of the mounting members 130 may additionally or alternatively be any other type of mounting member, such as, but not limited to, a post, a latch, a spring, a snap-fit member, an interference-fit member, a rivet, a pop rivet, a threaded fastener, and/or the like.

As shown in FIGS. 5 and 6, the cover 128 includes one or more openings 152 that receive the anvils 124 of the base frame 108. The cover 128 may include one or more cut-outs 132 for providing access to the electrical connector 106. The cover 128 includes an opening 154 that exposes the LED 138 to an area exterior of the light emitter module 200. The opening 154 may have any size and any shape. In the shown embodiment, the opening 154 has a circular shape and a complementary size relative to the LED 138. The cover 128 may further include one or more optic features, such as a lens, a screen, a transparent cover, and/or the like, that extend over the opening 154. The LED 138 may be considered to be exposed by the opening 154 through the optic feature.

Figure 7:
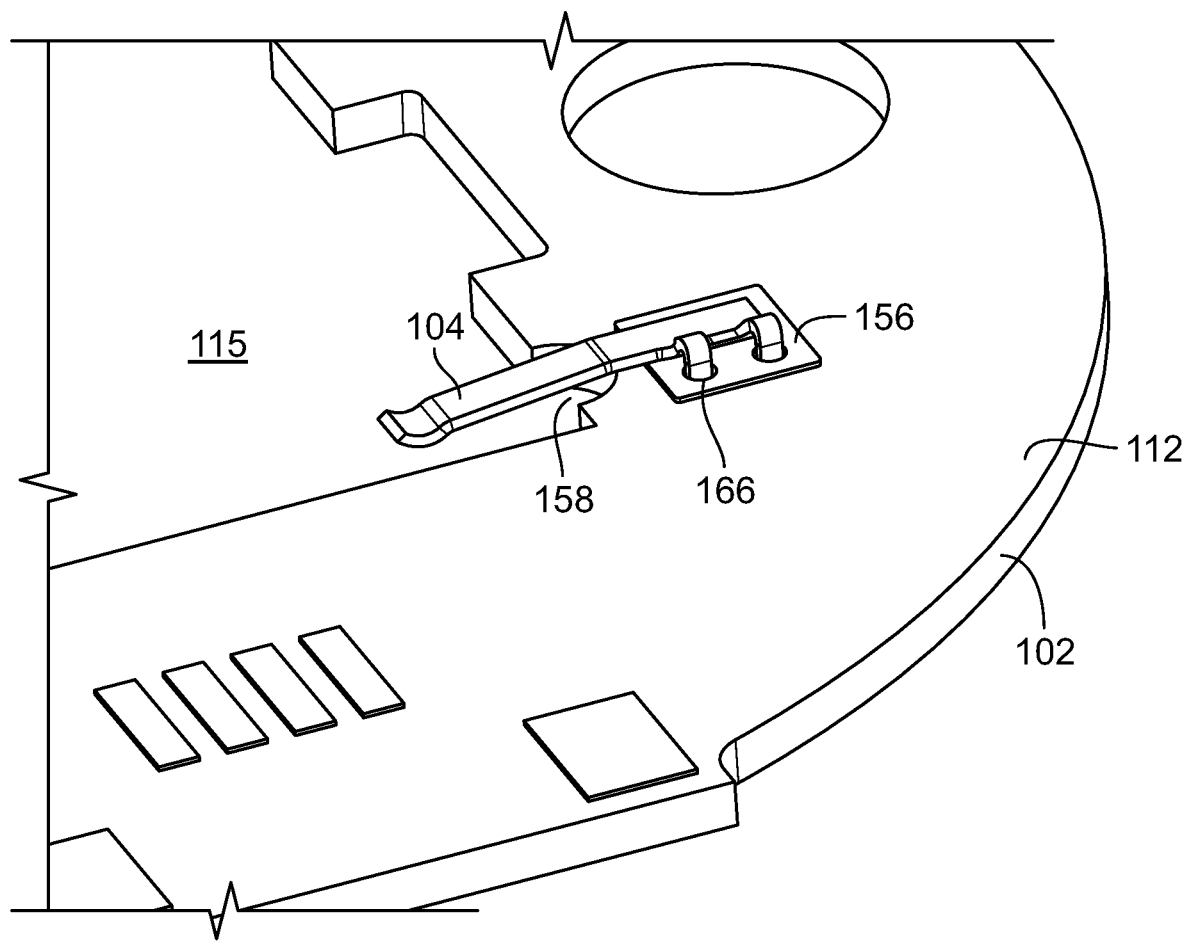
FIG. 7 is a perspective view of the isolator PCB.

As shown in FIG. 7, the contact element 104 has an elongated form and is fabricated from a resilient, electrically conductive material, such as a metal. The contact element 104 protrudes into the cut-out 115 in order to electrically contact the power pads 144 of the LED package 134. The contact element 104 is formed as a cantilever that is fixed at a solder pad 156 arranged on the first surface 112 of the PCB 102. A notch 158 allows the contact element 104 to be mechanically biased against the surface of the LED package 134 carrying the power pads 144.

Figure 8:
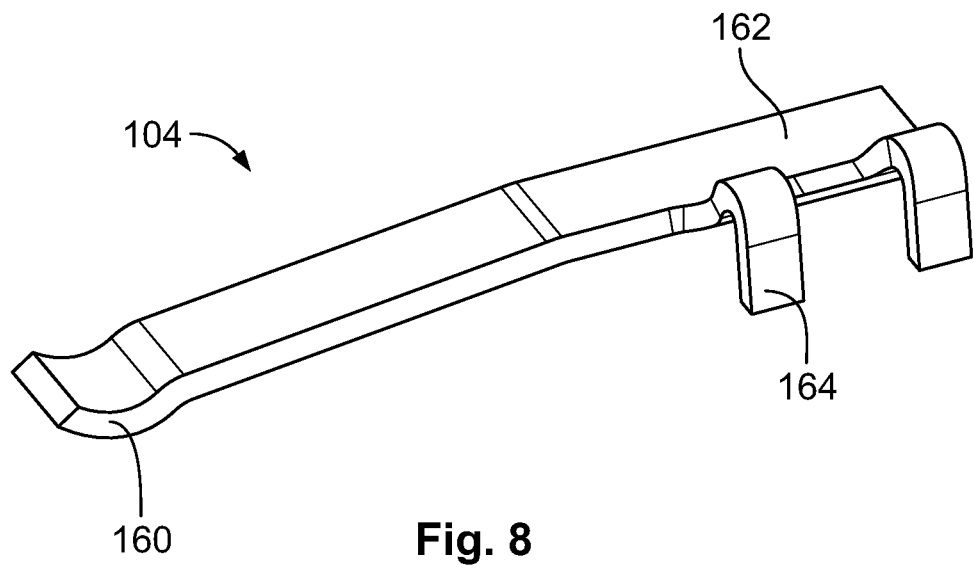
FIG. 8 is a perspective view of a contact element of the socket assembly.

The contact element 104, as shown in FIG. 8, has a contact region 160 that electrically contacts the power pad 144 of the LED package 134. The contact region 160 has a curved outline in order to provide a linear contact between the power pad 144 and the contact element 104. At the peripheral end opposite the contact region 160, the contact element 104 has a connecting region 162 that connects the contact element 104 to the printed circuit board 102. In the shown embodiment, the connecting region 160 includes two connecting pins 164 that are introduced into connecting receptacles 166 of the PCB 102. A solder connection firmly fixes the contact element 104 at the solder pad 156. However, in another embodiment, the pins 164 may be fixed only by a press-fit connection. Moreover, in other embodiments, any number of connecting pins 164 (or none at all) is also possible.

The base frame 108, as shown in FIG. 9, is formed from a stamped and bent metal sheet. In other embodiments, the base frame 108 can be formed of other suitably thermally conductive plastic materials or cast metal. The base frame 108 has a smooth base 120 that provides a large area thermal contact to the second surface 110 of the PCB 102. Consequently, heat generated by electronic components assembled on the first surface 112 of the PCB 102 can easily be dissipated. The LED package 136 is laterally held by spring elements 116. The spring finger 122 holds the LED package 134 on to a support structure in the finally mounted state. However, even without the support structure, the LED package 134 is fixed at the base frame 108 by the spring elements 116 applying a force within the plane 168 of the recess 114 shown in FIG. 9. The anvils 124 are formed to have a resilient base 170 shown in FIG. 9. The anvils 124 are fixed at the base 120 of the base frame 108 resiliently so that any tolerances can be compensated in order to ensure an optimal thermally conducting contact between the base frame 108 and the PCB 102.

An electronic operation of the light emitter module 200 including the socket assembly 100 will now be described in greater detail with reference to FIGS. 10-13.

Figure 10:
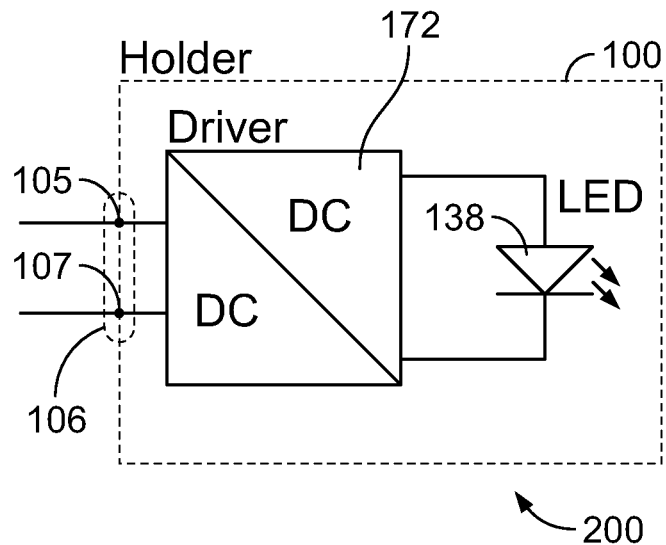
FIG. 10 is a circuit diagram of an architecture for operating the light emitter module.

The light emitter module 200, as shown in FIG. 10, includes an integrated driver unit 172. In an embodiment, the driver unit 172 is part of the electronic component 146. The driver unit 172 is assembled on the PCB 102 and therefore needs no additional space. Further, it can be ensured that the LED 138 is never operated with a non-compatible driver circuit. The light emitter module 200 is provided via the electrical connector 106 with an input voltage in the ON state of an external switch or with no power in the OFF state of the external switch. Depending on the input at the connector 106, the driver unit 172 provides a forward current (IF) to the LED 138, causing the LED 138 to emit radiation. For instance, a first input terminal 105 of the driver unit 172 is connected to a 0 V reference potential, and a second input terminal 107 of the driver unit 172 is connected to a 48 V power supply.

Figure 11:
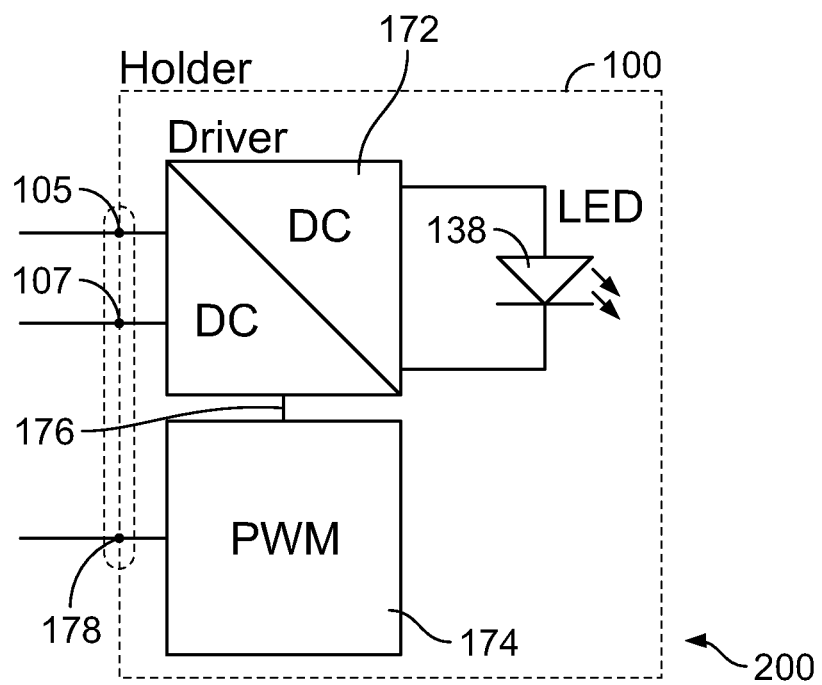
FIG. 11 is a circuit diagram of another architecture for operating the light emitter module.

As shown in FIG. 11, the light emitter module 200 also includes a dimming unit 174. The dimming unit 174 may be part of the electronic component 146. In an embodiment, the dimming unit 174 is a pulse width modulator (PWM) unit 174 that is connected to a control terminal 176 of the driver unit 172. The PWM unit 174 controls the driver unit 172 so that it switches the LED 138 on and off at a high rate. The effective IF becomes the time-based average of IF when the LED 138 is on and when it is off. When using the PWM method of LED dimming, the on/off frequency must be faster than the human eye can detect to avoid visible flicker. PWM frequencies of 200 Hz or greater usually avoid flicker problems. The electrical connector 106 may additionally comprise an input terminal 178 for inputting a signal that is controlling the PWM unit 174. The PWM unit 174 is supplied with a control signal such as an analog DC signal, e. g. a 0 V to 10 V signal. The value 0 V represents an OFF state of the LED 138, whereas 10 V represent the maximum brightness, i. e. 100% brightness. According to the voltage present at the input terminal 178, the PWM unit 174 generates a pulse train that is input to the control terminal 176 of the driver unit 172 as an alternating PWM signal. The PWM unit 174 thus translates the analog value into a pulse train that switches the LED 138 on and off to emit a desired average luminous flux. The PWM level is set by the 0 V to 10 V signal.

Figure 12:
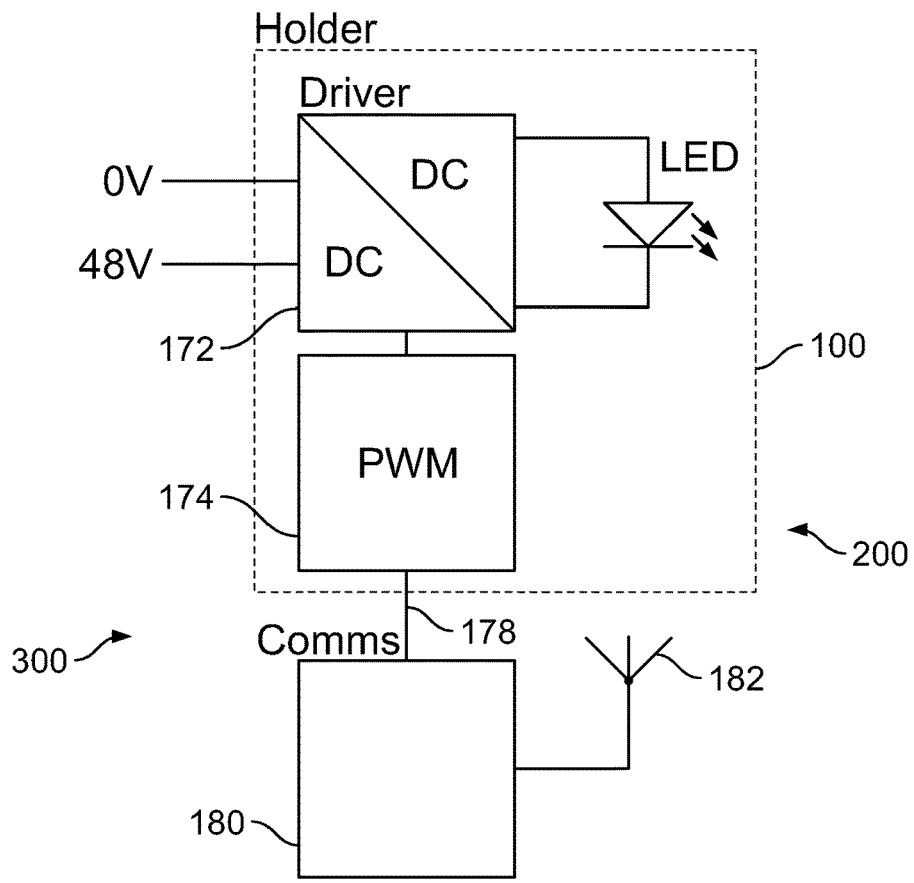
FIG. 12 is a circuit diagram of another architecture for operating the light emitter module.

As shown in FIG. 12, the light emitter module 200 is part of a lighting system 300. The input terminal 178 of the PWM 174 is connected to a wireless communication unit 180. In an embodiment, the wireless communication unit 180 is part of the electronic component 146. The wireless communication unit 180 has an antenna 182 for transmitting and receiving wireless signals to/from an external controller. The wireless communication unit 180 may comprise a radio communication unit, such as for instance Bluetooth or 6LoWPAN (IPv6 over Low power Wireless Personal Area Network), or an infrared communication unit.

Figure 13:
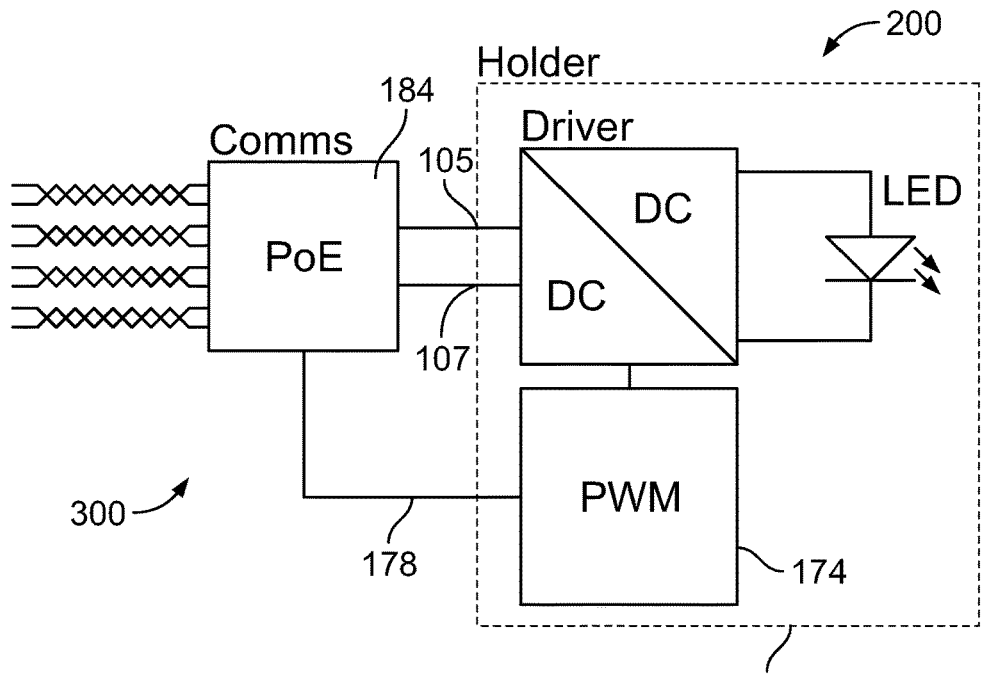
FIG. 13 is a circuit diagram of another architecture for operating the light emitter module.

Instead of a wireless connection, as shown in FIG. 13, the light emitter module 200 may be connected to a wirebound communication unit 184. In an embodiment, the wirebound communication unit 184 is part of the electronic component 146. The wirebound communication unit 184 may comprise a power over Ethernet (PoE) communication device and is compatible with existing PoE setups. In the case of a PoE communication unit 184, the DC voltage at the second terminal 107 may for instance be between 42.5 V and 57 V. The DC signal 178 that is provided to the PWM unit 174 is between 0 V and 10V, so that the PWM level is set by the 0 V to 10 V signal. The wirebound communication unit 184 may also be an integral part of the socket assembly 100, being assembled on the isolator PCB 102; in this case the electrical connector 106 is a corresponding standard PoE connector. Instead of the PoE architecture as shown in FIG. 13, any other wirebound communication structure may also be used according to the present invention, essentially replacing the antenna 182 of FIG. 12 by a wired connection.

What is claimed is:

1. A socket assembly, comprising:
   a base frame formed of a thermally conductive material and holding a light emitting diode (LED) package to a support structure, the LED package including an LED printed circuit board (PCB) having an LED mounted on the LED PCB, the base frame includes a base configured to be mounted to the support structure and defining a compressible spring element that extends from the base and is configured to mechanically engage the LED PCB and apply a clamping force to the LED PCB for clamping the LED PCB to the base with a predetermined holding force independently from the support structure, the base defines a recess formed therethrough for receiving the LED package, the compressible spring element extending radially inwards from the base into the recess for exerting a clamping force on the LED PCB in a direction of and within a plane of the recess, the compressible spring element is formed integrally with the base and is defined by a portion of the base protruding into the recess and a slot formed through the base between the portion of the base protruding into the recess and a remaining portion of the base, and wherein, with the LED package received within the recess, the protruding portion of base defining the compressible spring element is compressed in a direction toward the slot for generating the clamping force on the LED PCB;
   a contact element electrically contacting the LED package; and
   an isolator PCB, the contact element is arranged on the isolator PCB and electrically connects the isolator PCB to the LED PCB, the isolator PCB configured to be electrically connected to an electrical power supply for supplying electrical power to the LED, the isolator PCB has a first surface and a second surface, the second surface is in heat transmitting contact with the base frame, an electronic component is disposed on the first surface of the isolator PCB and is electrically connected to the LED.

2. The socket assembly of claim 1, wherein the electronic component includes an active driver unit for controlling power provided to the LED.

3. The socket assembly of claim 2, wherein the electronic component includes a communication unit in communication with an external controller.

4. The socket assembly of claim 3, wherein the electronic component is a dimming unit for controlling a luminous flux emitted by the LED.

5. The socket assembly of claim 4, wherein the dimming unit is a pulse width modulator (PWM) unit.

6. The socket assembly of claim 5, wherein the PWM unit has an input terminal and a control terminal, the PWM unit receiving a control signal at the input terminal and the output terminal is connected to the driver unit to provide the driver unit with an alternating PWM signal in response to the control signal.

7. The socket assembly of claim 1, further comprising an electrical connector arranged on the isolator PCB and configured to be mated with a mating connector for supplying power to the LED.

8. The socket assembly of claim 1, wherein the base frame has a spring finger that extends from the base and is configured to engage the LED PCB and apply a clamping force to the LED PCB in a direction of the support structure.

9. The socket assembly of claim 1, further comprising a cover that includes an opening configured to expose the LED.

10. The socket assembly of claim 9, wherein the cover receives an anvil of the base frame to mechanically connect the cover to the base frame.

11. The socket assembly of claim 1, wherein the compressible spring element comprises a first compressible spring element and a second compressible spring element arranged on opposing sides of the recess and configured to apply opposing clamping forces on the LED PCB in respective directions along the plane of the recess.

12. A light emitter module, comprising:
   a light emitting diode (LED) package including an LED printed circuit board (PCB) having an LED mounted on the LED PCB; and
   a socket assembly including:
   a base frame formed of a thermally conductive material for holding the light emitting diode package to a support structure, the base frame includes a base configured to be mounted to the support structure and configured to mechanically engage the LED PCB so that the LED package is attached to the support structure with a predetermined holding force;
   a contact element electrically contacting the LED package; and an isolator PCB, the contact element is arranged on the isolator PCB and electrically connects the isolator PCB to the LED PCB, the isolator PCB configured to be electrically connected to an electrical power supply for supplying electrical power to the LED, the isolator PCB has a first surface and a second surface, the second surface is in heat transmitting contact with the base frame, an active electronic component for controlling the operation of the LED is disposed on the first surface of the isolator PCB and is electrically connected to the LED, the electronic component including a dimming unit for controlling a luminous flux emitted by the LED and the dimming unit is a pulse width modulator (PWM) unit.

13. The light emitter module of claim 12, further comprising a communication unit controlling the electronic component.

14. The light emitter module of claim 13, wherein the communication unit is a wireless communication unit or a wirebound communication unit.

15. The light emitter module of claim 12, wherein the electronic component includes a driver unit for controlling power to the LED and the PWM unit has an input terminal and a control terminal, the PWM unit receiving a control signal at the input terminal and the output terminal is connected to the driver unit to provide the driver unit with an alternating PWM signal in response to the control signal.

16. The light emitter module of claim 15, wherein the communication unit outputs the control signal to the input terminal of the PWM unit.

17. A socket assembly, comprising:
a base frame configured to attach to a support structure and formed of a thermally conductive material, the base frame defining:
a recess for receiving a light emitting diode (LED) package; and
a first compressible spring element and a second compressible spring element extending from the base frame and into the recess for clamping the LED package to the base frame, the first and second compressible spring elements arranged on opposing sides of the recess and configured to apply opposing clamping forces on the LED PCB in respective directions along the plane of the recess to secure the LED package to the base frame independently from the support structure;
a contact element electrically contacting the LED package; and
an isolator PCB, the contact element is arranged on the isolator PCB and electrically connects the isolator PCB to the LED package, the isolator PCB configured to be electrically connected to an electrical power supply for supplying electrical power to the LED package, the isolator PCB has a first surface and a second surface, the second surface is in heat transmitting contact with the base frame, an active electronic component for controlling the LED package is disposed on the first surface of the isolator PCB.

\* \* \* \* \*